(12) United States Patent
Jeon et al.

(10) Patent No.: US 7,064,378 B2
(45) Date of Patent: Jun. 20, 2006

(54) LOCAL-LENGTH NITRIDE SONOS DEVICE HAVING SELF-ALIGNED ONO STRUCTURE AND METHOD OF MANUFACTURING THE SAME

(75) Inventors: Hee-Seog Jeon, Hwasung (KR); Seung-Beom Yoon, Suwon (KR); Yong-Tae Kim, Youngin (KR)

(73) Assignee: Samsung Electronics Co., Ltd. (KR)

( * ) Notice: Subject to any disclaimer, the term of this patent is extended or adjusted under 35 U.S.C. 154(b) by 172 days.

(21) Appl. No.: 10/832,948

(22) Filed: Apr. 27, 2004

(65) Prior Publication Data
US 2005/0059209 A1    Mar. 17, 2005

(30) Foreign Application Priority Data
Sep. 15, 2003    (KR) .................... 10-2003-0063578

(51) Int. Cl.
*H01L 29/788*    (2006.01)

(52) U.S. Cl. ................. 257/315; 257/E21.68

(58) Field of Classification Search ............... 257/314, 257/315
See application file for complete search history.

(56) References Cited

U.S. PATENT DOCUMENTS

| | | | |
|---|---|---|---|
| 5,459,091 A | 10/1995 | Hwang | 437/43 |
| 2002/0100926 A1 | 8/2002 | Kim et al. | 257/296 |
| 2003/0160280 A1* | 8/2003 | Yoshino | 257/324 |
| 2004/0183106 A1* | 9/2004 | Kim et al. | 257/239 |
| 2005/0054167 A1* | 3/2005 | Choi et al. | 438/287 |

* cited by examiner

*Primary Examiner*—Bradley K. Smith
(74) *Attorney, Agent, or Firm*—Mills & Onello LLP

(57) ABSTRACT

In a local-length nitride SONOS device and a method for forming the same, a local-length nitride floating gate structure is provided for mitigating or preventing lateral electron migration in the nitride floating gate. The structure includes a thin gate oxide, which leads to devices having a lower threshold voltage. In addition, the local-length nitride layer is self-aligned, which prevents nitride misalignment, and therefore leads to reduced threshold voltage variation among the devices.

27 Claims, 10 Drawing Sheets

LOCAL-LENGTH NITRIDE SONOS DEVICE HAVING SELF-ALIGNED ONO STRUCTURE AND METHOD OF MANUFACTURING THE SAME

RELATED APPLICATIONS

This application claims priority under 35 U.S.C. 119 to Korean Patent Application Serial Number 2003-63578, filed Sep. 15, 2003, the contents of which are incorporated herein by reference, in their entirety.

BACKGROUND OF THE INVENTION

Non-volatile memory devices find widespread application in electronic systems that do not receive continuous power, for example in applications where power is not always available, where power is frequently interrupted, and/or where low-power usage is desired. Example applications include mobile telecommunication systems, memory cards for storing music and/or image data, and system-on-a-chip applications that include a processing unit and a memory unit.

Cell transistors in non-volatile memory devices commonly employ a stacked gate structure that is formed over a channel region of a substrate between source/drain regions. The stacked gate structure includes a sequentially stacked gate insulating layer or "tunneling" layer, formed on the channel, floating gate electrode, inter-gate dielectric layer or "blocking" layer, and control gate electrode. The floating gate electrode and the control gate electrode are capacitively coupled to allow for programming of the floating gate during a programming stage of the transistor. At the same time, the floating gate electrode is isolated between the gate insulating layer and the inter-gate dielectric layer to prevent the migration of charge from the floating gate to the substrate or from the floating gate to the control gate during operation of the transistor following the programming stage.

Certain types of non-volatile memory devices include a SONOS structure formed of the sequential layers Silicon-Oxide-Nitride-Oxide-Silicon. An example of a SONOS structure is shown in FIG. 1. A channel region is formed on a silicon substrate 10 between source/drain regions 30a, 30b. A tunneling layer 12 formed of oxide, for example $SiO_2$, is formed on the substrate 10. A nitride layer 14 is formed on the tunneling layer 12 and provides a charge-trapping layer that serves as a floating gate. A second oxide layer 16 is formed on the nitride layer 14, the second oxide layer 16 serving as a blocking layer. Together, the oxide tunneling layer 12, the nitride floating gate layer 14 and the oxide charge-trapping layer 16 form an oxide-nitride-oxide, or ONO, structure 20. A silicon layer 25 is provided on the second oxide layer 16 as a control gate electrode. SONOS-type non-volatile memory devices have relatively thin cells which are inexpensive to manufacture and can be readily incorporated into both a peripheral region and/or a logic region of an integrated circuit.

During a charging operation, a large positive voltage is applied to the control gate relative to the substrate. Electrons migrate from an inversion channel region or drain region through the channel region and penetrate into the nitride floating gate through the tunneling oxide layer. Electrons from the semiconductor substrate thereby become trapped in the nitride trapping layer. Since, during the programming operation, a higher bias voltage is applied to the drain relative to the source, a high concentration of electrons accumulates in the nitride trapping layer in the region proximal to the high-biased drain. Conversely, during a discharge operation, a negative voltage is applied to the control gate, and a positive voltage is applied to the substrate. During a discharge operation, the electrons previously stored in the floating gate are released back into the substrate through the gate insulating layer. Holes from the semiconductor substrate thereby become trapped in the trapping layer. Since, during the discharge operation, a higher bias voltage is applied to the drain relative to the source, a high concentration of holes accumulates in the nitride trapping layer in the region proximal to the high-biased drain. The amount of electrons or holes in the nitride floating gate trapping layer changes the threshold voltage of the transistor. In this manner, a charged transistor is interpreted as a first binary value, for example, a "1", and a discharged transistor is interpreted as second binary value, for example, a "0", during a read operation of the transistor.

Since the ONO structure exists across the entire channel region, the SONOS transistor of FIG. 1 above has a high initial threshold voltage, which leads to corresponding high power consumption in the device, and a high programming current. As a result, such a configuration does not apply well to system-on-a-chip products, which commonly require low power consumption, especially for portable applications that rely on battery power. In addition, electrons trapped in the nitride floating gate can migrate laterally along the nitride layer; as a result, an erase operation may not completely remove the electrons from the floating gate, which can adversely affect the threshold voltage of the transistor during a subsequent read operation.

To address these limitations, local-length nitride and thin-gate oxide transistors have been developed, as shown in FIG. 2. In this configuration, drain regions 68b are positioned on each side of a source region 68a in a semiconductor substrate 50. Two gate structures are formed simultaneously on adjacent channel regions on each side of the central source region 68a. A thin gate oxide layer 52 is provided on the channel region between the source 68a and drain 68b regions. A local-length nitride layer 54 is on the gate oxide layer 52 in a region that is proximal to the drain 68b. A blocking oxide layer 58 is on the local-length nitride layer 54. A control gate 65, for example formed of polysilicon, covers the resulting ONO structure 62.

In this configuration, the local-length nitride trapping layer 54 prevents lateral movement of electrons during a discharge operation, and therefore the reliability of the threshold voltage is improved. In addition, thin gate oxide layer 52 allows for a lower threshold voltage. However, the operating characteristics of the SONOS cell are highly dependent on the nitride length; for example, threshold voltage can vary considerably with varying nitride length. Since the conventional processes rely on photolithographic techniques to define the length of the nitride trapping layer, the processes are subject to misalignment. As shown in FIG. 2B slight misalignment of the photolithographic masks for forming the nitride trapping layer 52 can lead to adjacent devices having radically different nitride layer lengths $L_1$, $L_2$. This, in turn, can lead to significant variation in characteristics of the resulting transistors, including significant variation in threshold voltage.

SUMMARY OF THE INVENTION

The present invention is directed to a local-length nitride SONOS device and a method for forming the same. A local-length nitride floating gate structure is provided for mitigating or preventing lateral electron migration in the nitride floating gate. The structure includes a thin gate oxide, which leads to devices having a lower threshold voltage. In addition, the local-length nitride layer is self-aligned, which prevents nitride misalignment, and therefore leads to reduced threshold voltage variation among the devices.

In a first aspect, the present invention is directed to a semiconductor device. The device includes a semiconductor substrate, and first and second spaced apart junction regions provided in the semiconductor substrate. A first dielectric layer is on the semiconductor substrate between the first and second junction regions. A second dielectric layer is on a first portion of the first dielectric layer. A conductor has a body portion formed on a second portion of the first dielectric layer, and has a lateral extension portion above the second dielectric layer. The lateral extension extends from a first side wall of the body portion below a top of the first side wall. The body portion and the lateral extension portion are spaced apart from the second dielectric layer.

In one embodiment, the body portion of the conductor has a second outer side wall opposite the first side wall that is curved. The body portion of the conductor is formed in an anisotropic etching process.

In another embodiment, the second dielectric layer encompasses the lateral extension portion of the conductor. The second dielectric layer extends along a portion of the bottom of the lateral extension portion of the conductor, a side of the lateral extension portion of the conductor, and a portion of a top of the lateral extension portion of the conductor. In another embodiment, the second dielectric layer further extends along a portion of the first side wall of the conductor. The lateral extension extends from a lower region of side wall.

In another embodiment, the first dielectric layer comprises silicon oxide. The second dielectric layer comprises a charge trapping layer or floating gate, for example formed of silicon nitride. The conductor comprises a control gate, for example formed of polysilicon. The first junction region comprises one of a drain and source region and the second junction region comprises the other of the drain and source regions.

In another embodiment, a third dielectric layer is formed between the body portion and the lateral extension portion of the conductor and the second dielectric layer. The third dielectric layer comprises a material that is the same as that of the first dielectric layer.

In another embodiment, the first dielectric layer comprises an oxide layer, the second dielectric layer comprises a nitride layer, and the third dielectric layer comprises a nitride layer, and the first, second and third dielectric layers form an ONO structure that is positioned between an upper surface of the substrate and a lower surface of the lateral extension portion of the conductor. The ONO structure has a thickness ranging between about 100 Å and 300 Å, for example about 140 Å and wherein the lateral extension portion of the conductor is on the ONO structure. The lateral extension of the conductor has a length ranging between about 1000 Å and 2000 Å, for example about 1500 Å.

In another aspect, the present invention is direct to a method of forming a semiconductor device. A first sacrificial layer is formed on a semiconductor substrate; A second sacrificial layer is formed on the first sacrificial layer. The second sacrificial layer is patterned to form an opening in the second sacrificial layer that exposes a portion of the first sacrificial layer. Spacers of a first dielectric material are formed on side walls of an opening of the second sacrificial layer. The first sacrificial layer is etched using the second sacrificial layer and the spacers as a mask to expose a portion of the semiconductor substrate. The exposed region between the spacers is filled with the first dielectric material to form a T-shaped structure of the first dielectric material on the semiconductor substrate. The first and second sacrificial layers are removed such that the T-shaped structure remains on the semiconductor substrate. A first oxide layer is provided on the semiconductor substrate. A nitride layer is provided on the first oxide layer. The nitride layer and the first oxide layer are etched using the T-shaped structure as a mask such that a nitride layer pattern and a first oxide layer pattern remain under upper overlap portions of the T-shaped structure. A second oxide layer is provided on the semiconductor substrate and the nitride layer pattern. Control gates are provided adjacent the second oxide layer. First junction regions are formed in the semiconductor substrate using the control gates as a mask.

In one embodiment, the method further comprises: forming a contact hole in a dielectric material between the control gates; and providing a metal stud in the contact hole that contacts an upper surface of the semiconductor substrate. A junction region is formed in the upper surface of the semiconductor substrate following forming the contact hole and before providing the metal stud in the hole.

In another embodiment, the first dielectric material comprises an oxide material or a nitride material. The control gates comprise a polysilicon material. Each of the control gates has a body portion formed on the second oxide layer and a lateral extension portion on the second oxide layer above the nitride layer pattern, the lateral extension extending from a first side wall of the body portion below a top of the first side wall, the body portion and the lateral extension portion being spaced apart from the nitride layer by the second oxide layer. The nitride layer extends along a portion of the bottom of the lateral extension portion of the conductor, a side of the lateral extension portion of the conductor, and a portion of a top of the lateral extension portion of the conductor.

In another embodiment, providing control gates comprises: following providing a second oxide layer, providing a conductive material layer on the substrate and the T-shaped structure; and anisotropically etching the conductive material layer to form the control gates on lateral portions of the T-shaped structure.

In another embodiment, the first oxide layer is further provided on sidewalls and a top portion of the T-shaped structure. The first sacrificial layer comprises dielectric material, for example nitride or oxide. The second sacrificial layer comprises a polysilicon material.

In another embodiment, the method further comprises, following etching the first sacrificial layer, forming a junction region in the exposed portion of the semiconductor substrate.

In another embodiment, the method further comprises, following providing the control gates, removing the T-shaped structure to expose the semiconductor substrate between the control gates. Following removing the T-shaped structure, a first junction region is formed in the exposed semiconductor substrate between the control gates. At the same time the first junction region is formed, second junction regions are formed in the semiconductor substrate adjacent outer side walls of the control gates.

In another embodiment, the nitride layer extends along a portion of the bottom of the lateral extension portion of the conductor, a side of the lateral extension portion of the conductor, and a portion of a top of the lateral extension portion of the conductor.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

In the following description of preferred embodiments of the present invention and in the claims that follow, the term "on", when referring to layers of material used in the fabrication of the semiconductor devices, refers to a layer that is directly applied to an underlying layer, or refers to a layer that is above an underlying layer with an optional intermediate layer or layers therebetween.

FIGS. 3A–3H are cross-sectional views of a first process for forming a local-length nitride SONOS device having a self-aligned nitride layer, in accordance with the present invention.

Figure 1:
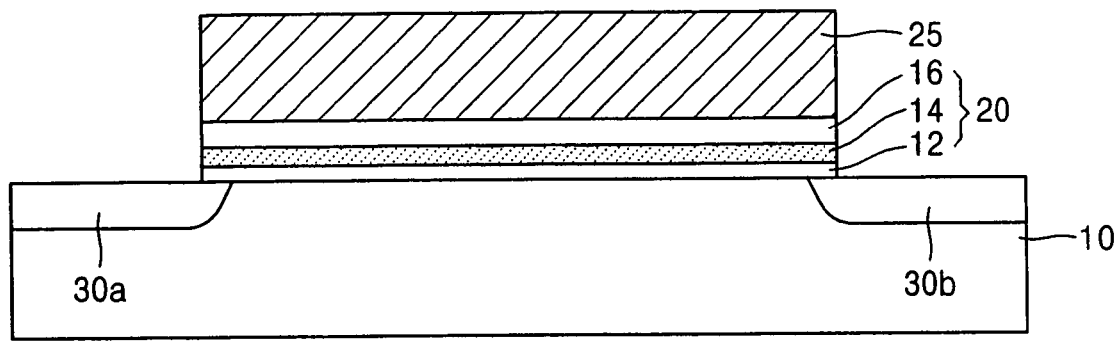
FIG. 1 is a cross-sectional view of a conventional SONOS device.
Figure 2A:
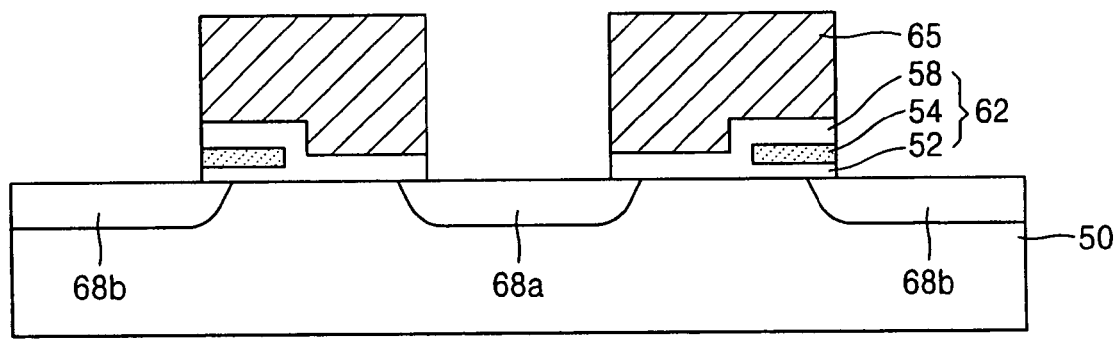
FIGS. 2A and 2B are cross-sectional views of a conventional local-length nitride SONOS device, illustrating variation in the nitride layer length as a result of misalignment of the photolithographic mask used for placing the nitride layer.
Figure 2B:
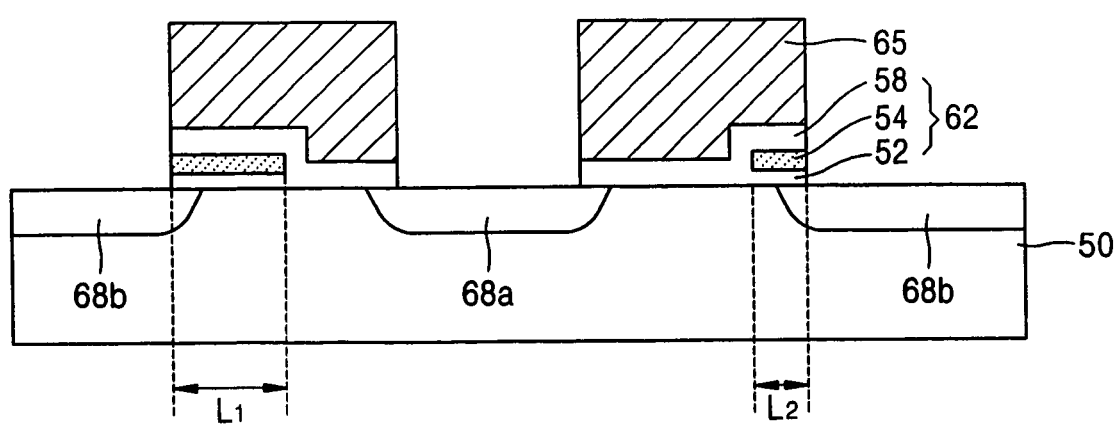
Figure 3A:
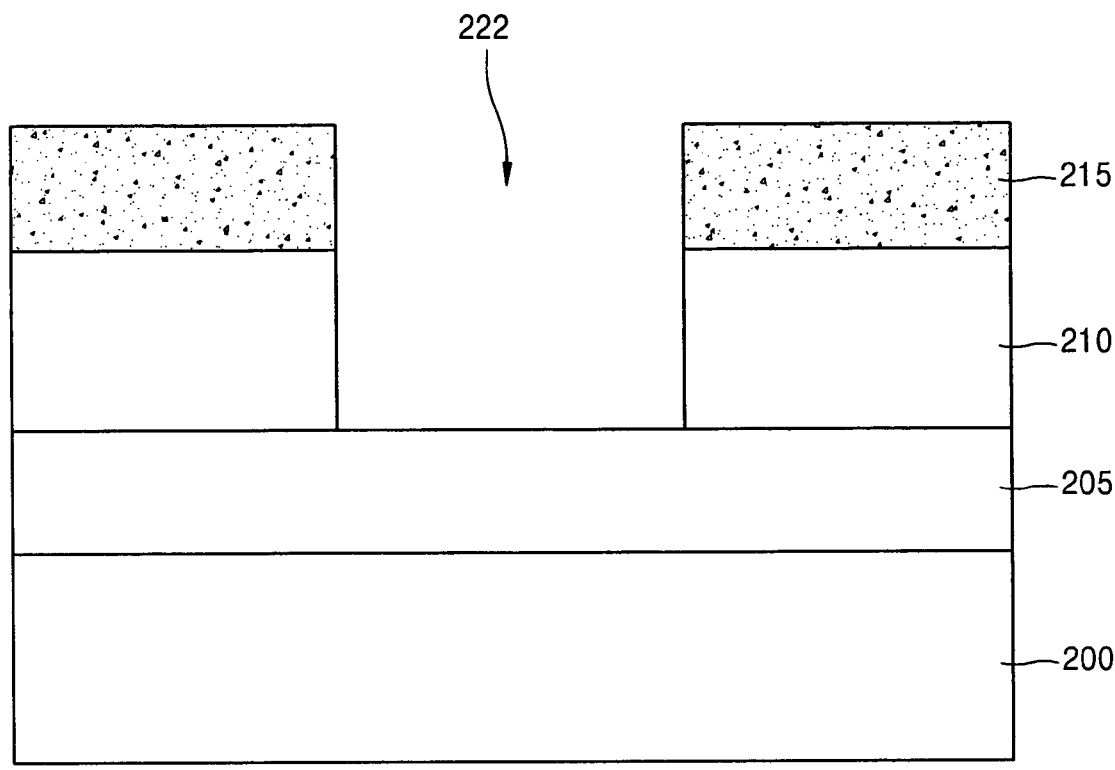
FIGS. 3A–3H are cross-sectional views of a first process for forming a local-length nitride SONOS device having a self-aligned nitride layer, in accordance with the present invention.

In FIG. 3A, a first sacrificial layer 205 is formed on a semiconductor substrate 200. In one embodiment, the semiconductor substrate 200 comprises a silicon substrate and the first sacrificial layer 205 comprises a dielectric layer, for example, nitride SiN, that is formed by chemical vapor deposition (CVD) to a thickness of 1000–2000 Å. A second sacrificial layer 210 is then formed on the first sacrificial layer 205. In one embodiment, the second sacrificial layer 210 comprises polysilicon that is formed by CVD to a thickness of 1000–3000 Å. The material of the second sacrificial layer 210 preferably has high etch selectivity with respect to the material of the first sacrificial layer 205. A photoresist layer is provided on the second sacrificial layer 210 to pattern the second sacrificial layer 210 to thus provide a relatively wide upper opening 222, for example on the order of 0.6–0.8 μm in width, in the second sacrificial layer 210.

Figure 3B:
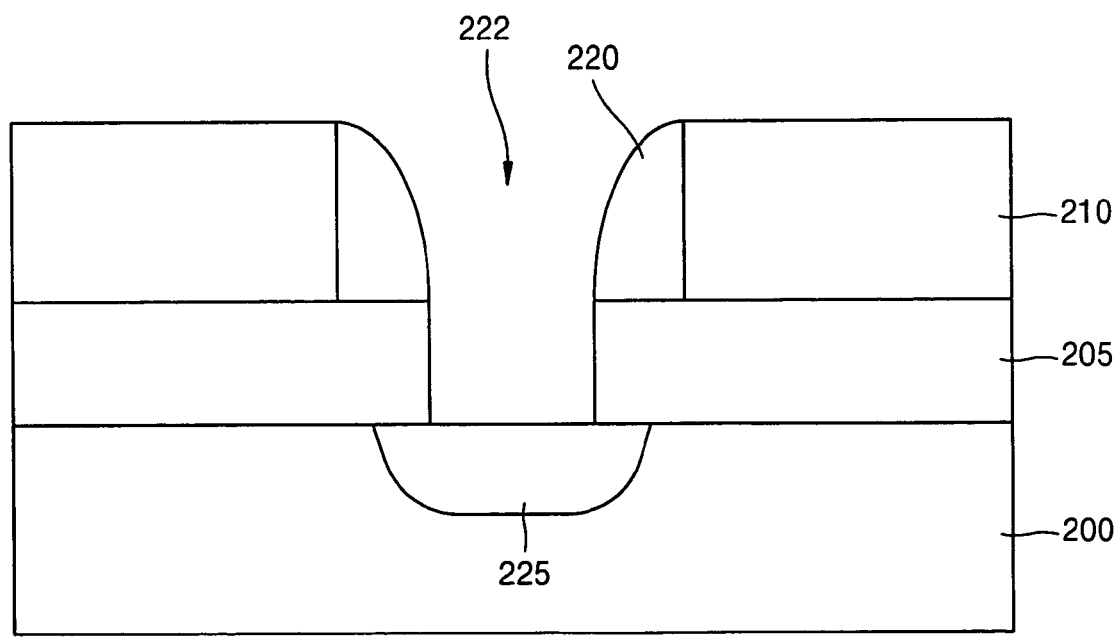

In FIG. 3B, a layer of first dielectric material is provided on the resulting structure. In one embodiment, the dielectric material comprises oxide $SiO_2$ that is formed by CVD to a thickness of 1000–4000 Å. The dielectric material layer is then anisotropically etched to form lateral spacers 220 on inner side walls of the upper opening 222. The thickness of the spacers 220, and therefore, the width of the opening between them is determined according the etch conditions. Following this, the first sacrificial layer 205 is etched using the resulting patterned second sacrificial layer 210 and spacers 220 as an etch mask. The results in a relatively narrow lower opening, for example on the order of 0.3–0.6 μm in width, in the first sacrificial layer 205 formed below the relatively wide upper opening 222 in the second sacrificial layer 210. A drain region 225 is then formed in the exposed substrate 200, for example using an ion implantation of arsenic (As) or phosphorous (P).

Figure 3C:
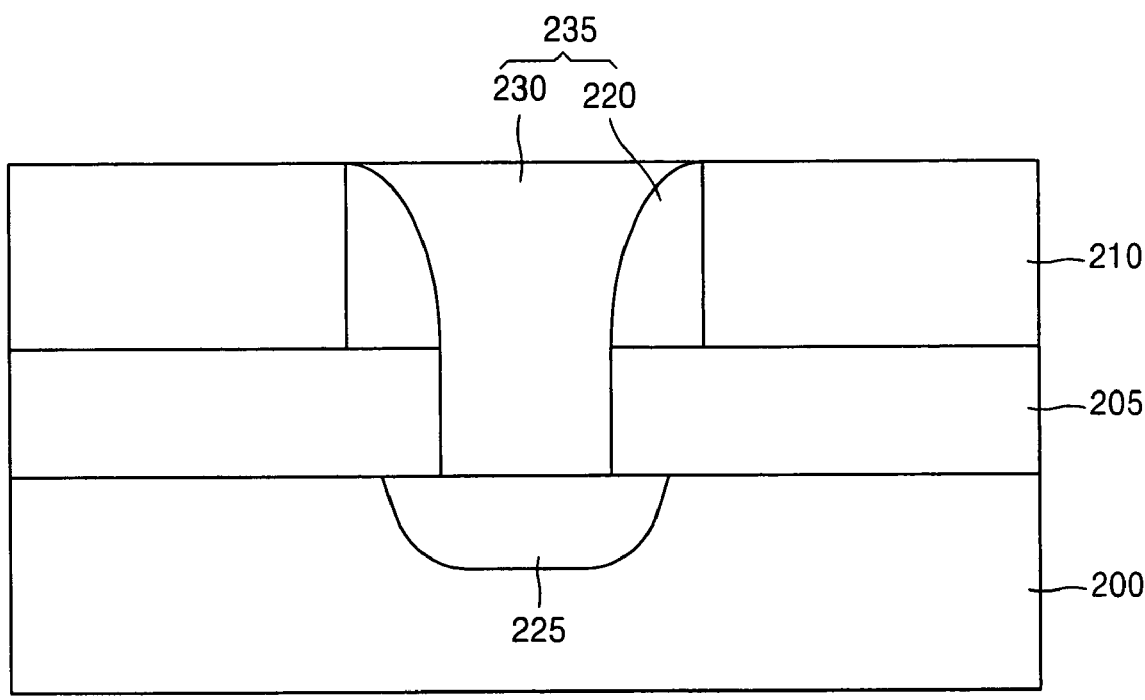

In FIG. 3C, the exposed region above the drain region 225 in the upper wide opening between the spacers 220 and the narrow lower opening is filled with a deposit of first dielectric material, for example oxide, using CVD. The resulting structure is then planarized, for example using an etching process or chemical-mechanical polishing (CMP). As a result, a T-shaped structure 235 formed of the first dielectric material fill 230 and the spacers 220 is provided on the semiconductor substrate 200.

Figure 3D:
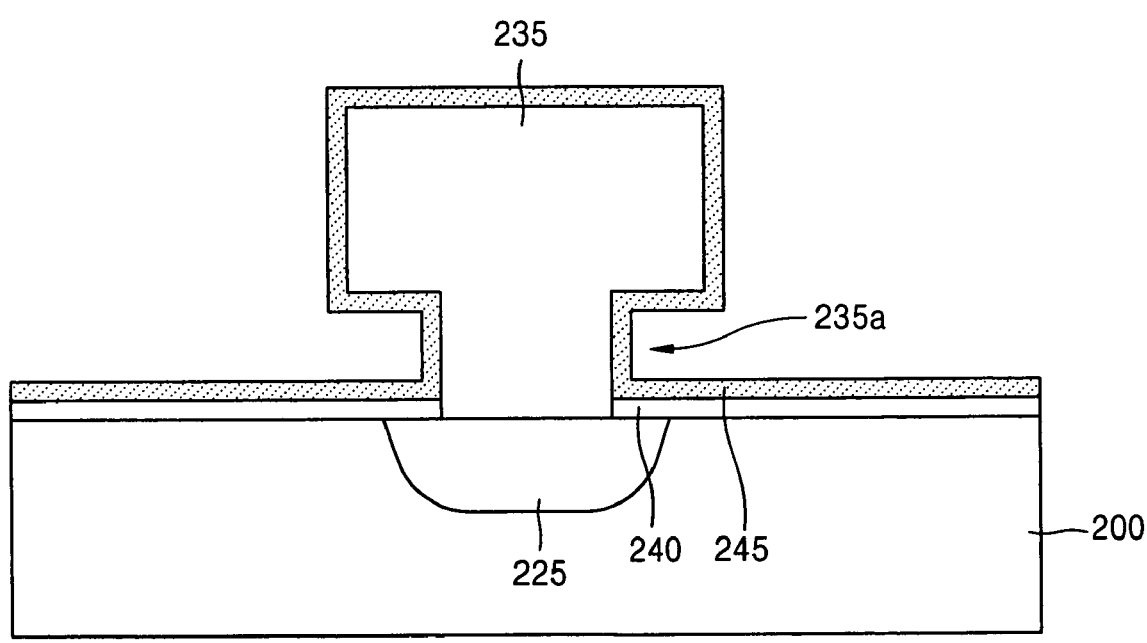

In FIG. 3D, the first and second sacrificial layers 205, 210 are removed to expose the T-shaped structure 235 of dielectric material. This is accomplished using conventional dry or wet etching techniques, for example using a multi-dimensional isotropic wet etch. Following this, a thin first oxide layer 240 is formed on exposed surfaces of the semiconductor substrate 200. In one embodiment, the first oxide layer 240 comprises thermally grown $SiO_2$ that is grown to a thickness of 40–80 Å. A nitride layer 245 is formed on exposed surfaces of the resulting structure, including the upper surface, and side surfaces 235a of the T-shaped structure 235. In one embodiment, the nitride layer 245 comprises SiN formed by CVD or atomic layer deposition (ALD) to a thickness of 40–120 Å.

Figure 3E:
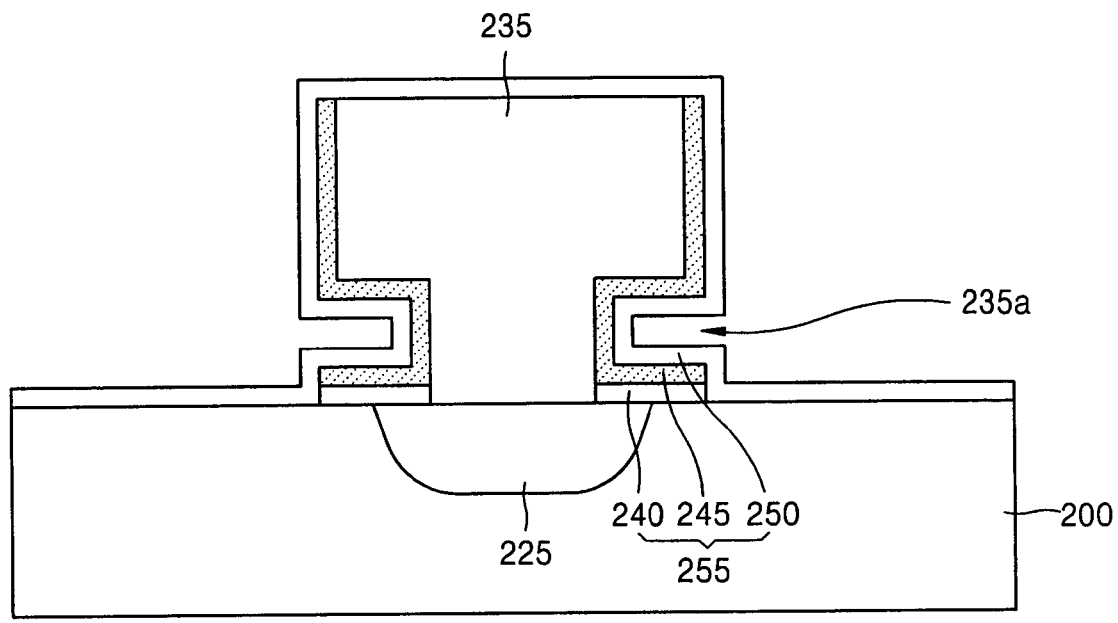

In FIG. 3E, the resulting structure is next anisotropically etched using the T-shaped structure 235 as a mask to remove portions of the nitride layer 245 and the first oxide layer 240 from the surface of the substrate 200. During this step, a small portion of the upper surface of the dielectric material of the T-shaped structure 235 is also etched. A second oxide layer 250 is then formed on the surface of the resultant structure, including the exposed upper surface of the dielectric T-shaped structure 235, side surfaces 235a of the T-shaped structure 235 having the nitride layer 245, the upper surface of the horizontal portion of the nitride layer 245 formed on the first oxide layer 240, and the remaining exposed surfaces of the semiconductor substrate 200. In one embodiment, the second oxide layer 250 comprises $SiO_2$ formed by CVD at a temperature of 650C.–700C. followed by a rapid thermal annealing (RTA) process at a temperature of 900C.–1100C. The respective thicknesses of the first oxide layer 240 and the second oxide layer 250 may be different, depending on the respective processes used in their formation.

Figure 3F:
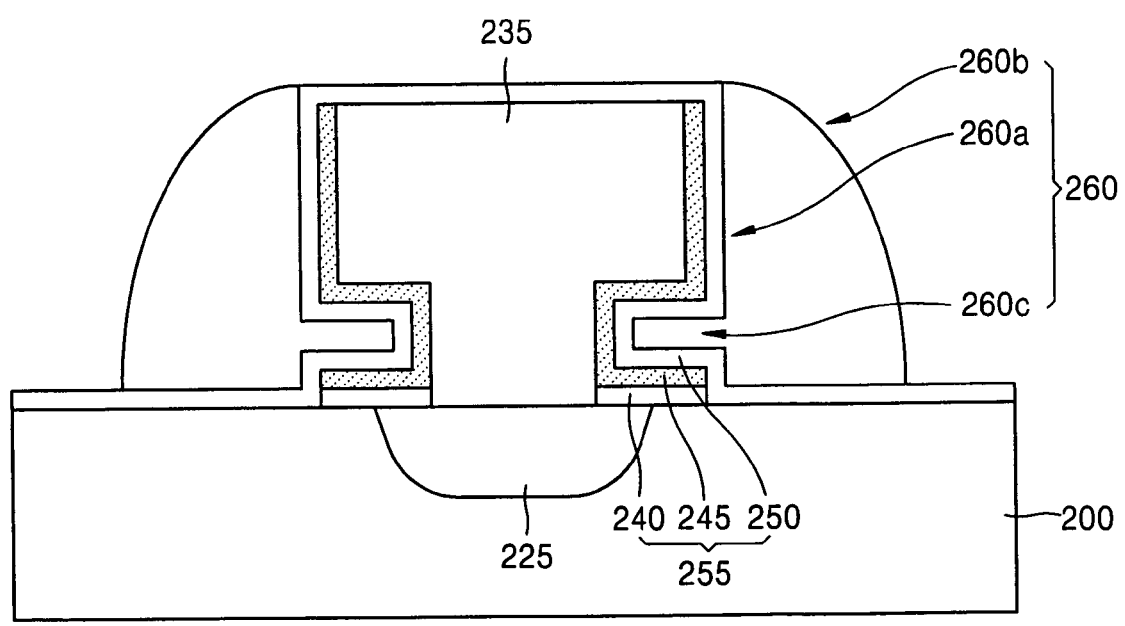

In FIG. 3F, control gates 260 are formed on sides of the resulting T-shaped structure 235 as shown. A conductive material layer is formed on the resulting structure. In one embodiment, the conductive material layer comprises polysilicon that is formed by CVD to a thickness of 2000–4000 Å. The resulting polysilicon layer is then anisotropically etched to form lateral conductive gates 260 on outer side walls of the T-shaped structure. The resulting conductive gates 260 include a main body 260a, an outer surface 260b and a lateral extension 260c. The lateral extension 260c extends beneath the relatively wide upper portion of the T-shaped structure 235, and above the horizontal portion of the second oxide layer 250 that lies above the nitride layer 245 and first oxide layer 240, to form a SONOS structure, as described below.

Figure 3G:
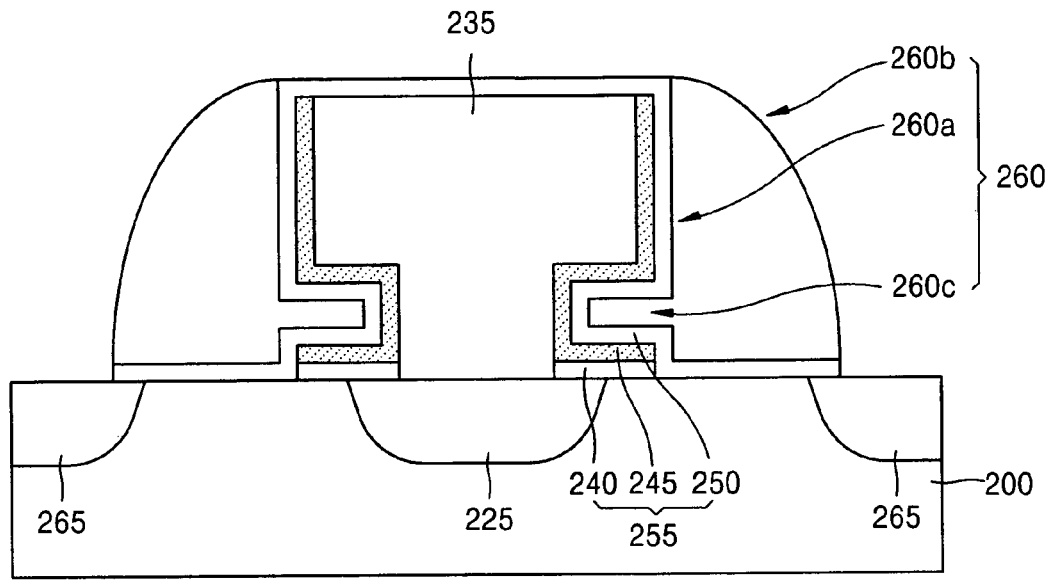

In FIG. 3G, the second oxide layer 250 is removed using the resulting structure as an etch mask, and source regions 265 are formed in the exposed substrate 200 adjacent the control gates 260, for example using an ion implantation of arsenic (As) or phosphorous (P).

Figure 3H:
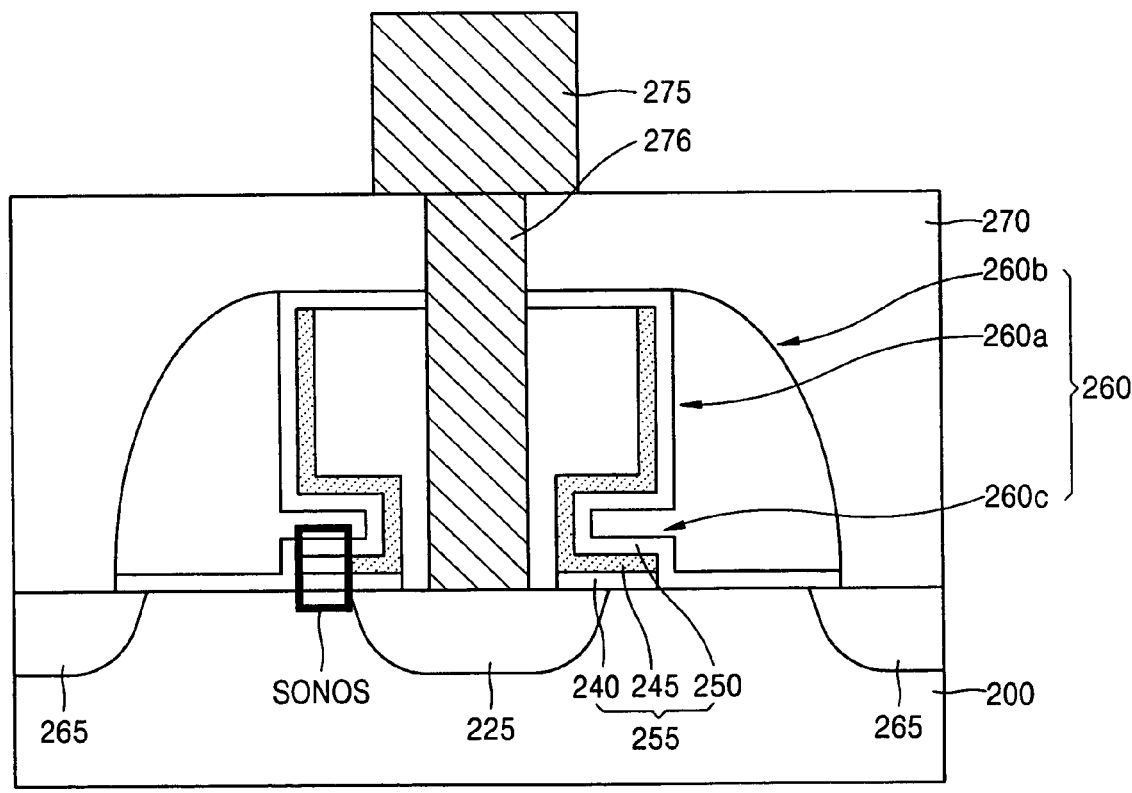

In FIG. 3H, an inter-layer dielectric (ILD) material layer 270 is deposited on the resulting structure. In one example, the ILD layer 270 comprises oxide $SiO_2$ that is formed by CVD to a thickness that is sufficient for coating the resultant structure. The ILD layer 270 is then etched to form openings for access to the drain region 225 and source regions 265 and a metal deposition is performed to form metal plugs 276 in the openings. A metal contact is then patterned on the ILD layer 270 above the metal plugs 276 using conventional means.

As mentioned above, the resulting device includes a SONOS structure, as illustrated in the highlighted region of FIG. 3H. The SONOS structure includes the Silicon of the semiconductor substrate 200, the Oxide of the first oxide tunneling layer 240, the Nitride of the local-length nitride layer 245 that operates as a charge trapping layer, the Oxide of the second oxide layer 240, and the Silicon of the lateral extension 260c of the polysilicon control gate 260. The respective horizontal lengths of the resulting local-length nitride layers 245 on opposite sides of the T-shaped structure 235 are controlled by the geometry of the T-shaped structure 235 itself. The geometry, and symmetry, of the T-shaped structure is determined based on the ability to form symmetrical spacers 220, which can be controlled to a high degree of precision, based on the anisotropic etching process for forming the spacers. In this manner, the resulting horizontal lengths of the opposed local-length nitride layers 245 are predictable and symmetric. As a result of the local-length nitride structures, lateral electron movement is mitigated or prevented, and because the nitride structures are self-aligned, their lengths are more consistent and predicable; therefore, variation in the threshold voltages of the resulting devices is mitigated.

FIGS. 4A–4J are cross-sectional views of a second process for forming a local-length nitride SONOS device having a self-aligned nitride layer, in accordance with the present invention.

Figure 4A:
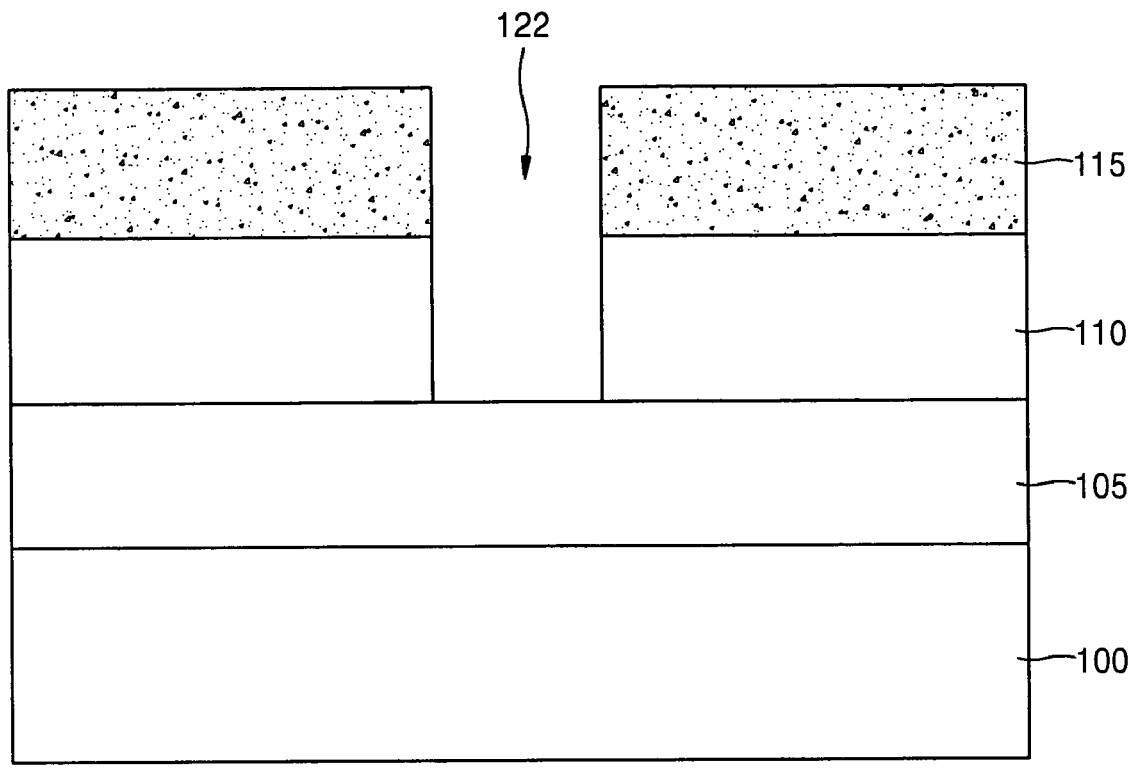
FIGS. 4A–4J are cross-sectional views of a second process for forming a local-length nitride SONOS device having a self-aligned nitride layer, in accordance with the present invention.

In FIG. 4A, a first sacrificial layer 105 is formed on a semiconductor substrate 100. In one embodiment, the semiconductor substrate 100 comprises a silicon substrate and the first sacrificial layer 205 comprises a dielectric layer, for example, oxide $SiO_2$, that is formed by chemical vapor deposition (CVD) to a thickness of 1000–2000 Å. A second sacrificial layer 110 is then formed on the first sacrificial layer 205. In one embodiment, the second sacrificial layer 110 comprises polysilicon that is formed by CVD to a thickness of 1000–3000 Å. The material of the second sacrificial layer 110 preferably has high etch selectivity with respect to the material of the first sacrificial layer 105. A photoresist layer 115 is provided on the second sacrificial layer 110 to pattern the second sacrificial layer 110 to thus provide a relatively wide upper opening 122, for example on the order of 0.6–0.8 μm in width, in the second sacrificial layer 110.

Figure 4B:
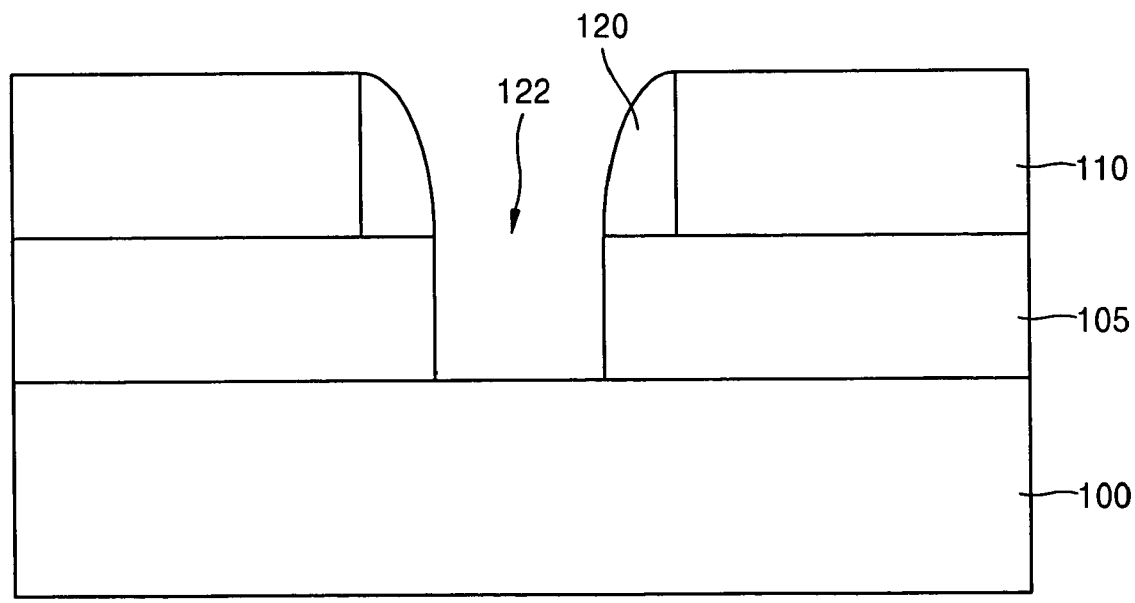

In FIG. 4B, a layer of first dielectric material is provided on the resulting structure. In one embodiment, the dielectric material comprises nitride SiN that is formed by CVD to a thickness of 1000–4000 Å. The dielectric material layer is then anisotropically etched to form lateral spacers 120 on inner side walls of the upper opening 122. The thickness of the spacers 120, and therefore, the width of the opening between them is determined according the etch conditions. Following this, the first sacrificial layer 105 is etched using the resulting patterned second sacrificial layer 110 and spacers 120 as an etch mask. The results in a relatively narrow lower opening, for example on the order of 0.3–0.6 μm in width, in the first sacrificial layer 105 formed below the relatively wide upper opening 122 in the second sacrificial layer 110.

Figure 4C:
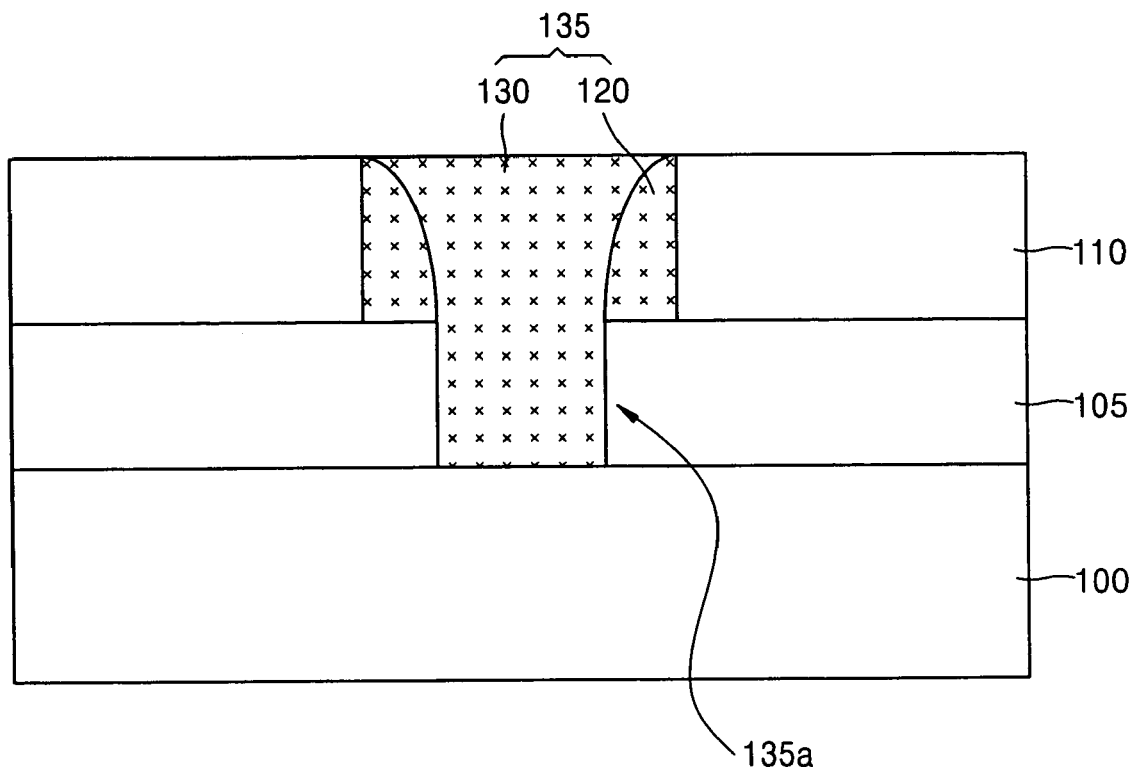

In FIG. 4C, the opening 122 including the wide portion between the spacers 120 and the narrow lower opening is filled with a deposit of first dielectric material, for example nitride SiN, using CVD. The resulting structure is then planarized, for example using an etching process or chemical-mechanical polishing (CMP). As a result, a T-shaped structure 235 formed of the first dielectric material fill 130 and the spacers 120 is provided on the semiconductor substrate 100.

Figure 4D:
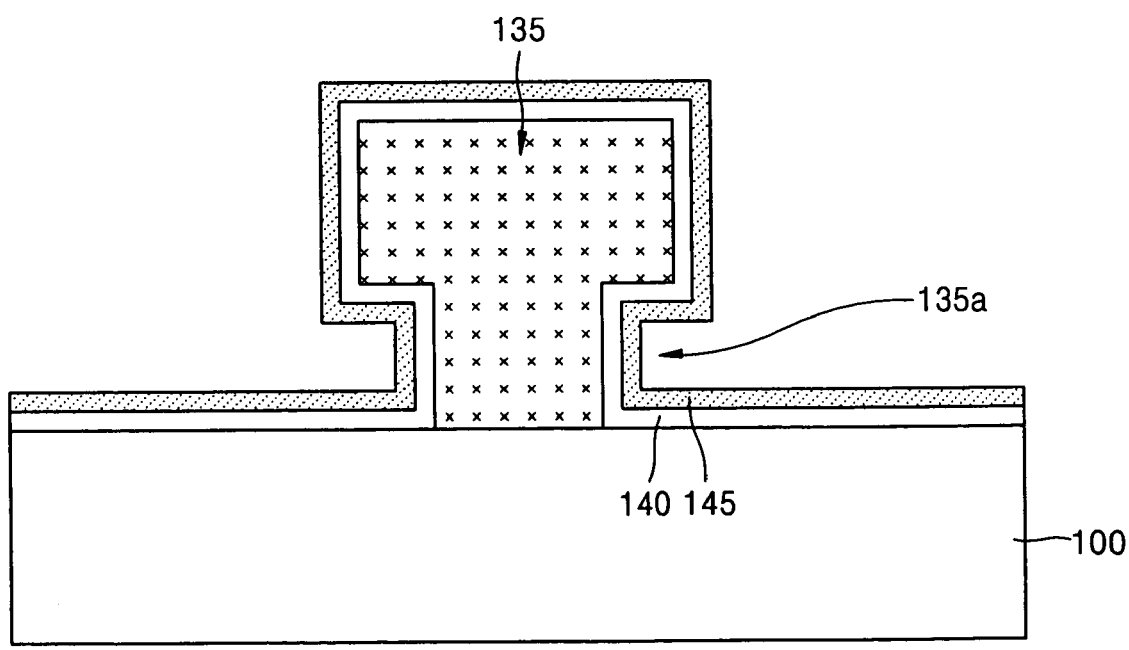

In FIG. 4D, the first and second sacrificial layers 105, 110 are removed to expose the T-shaped structure 135 of dielectric material. This is accomplished using conventional dry or wet etching techniques, for example using a multi-dimensional isotropic wet etch. Following this, a thin first oxide layer 140 is formed on the resulting structure, including the upper surface, and side surfaces 135a of the T-shaped structure 135. In one embodiment, the first oxide layer 140 comprises $SiO_2$ formed by CVD or atomic layer deposition (ALD) to a thickness of 40–80 Å. A nitride layer 145 is then formed on exposed surfaces of the resulting structure, including the upper surface, and side surfaces 135a of the T-shaped structure 135. In one embodiment, the nitride layer 145 comprises SiN formed by CVD or atomic layer deposition (ALD) to a thickness of 40–120 Å.

Figure 4E:
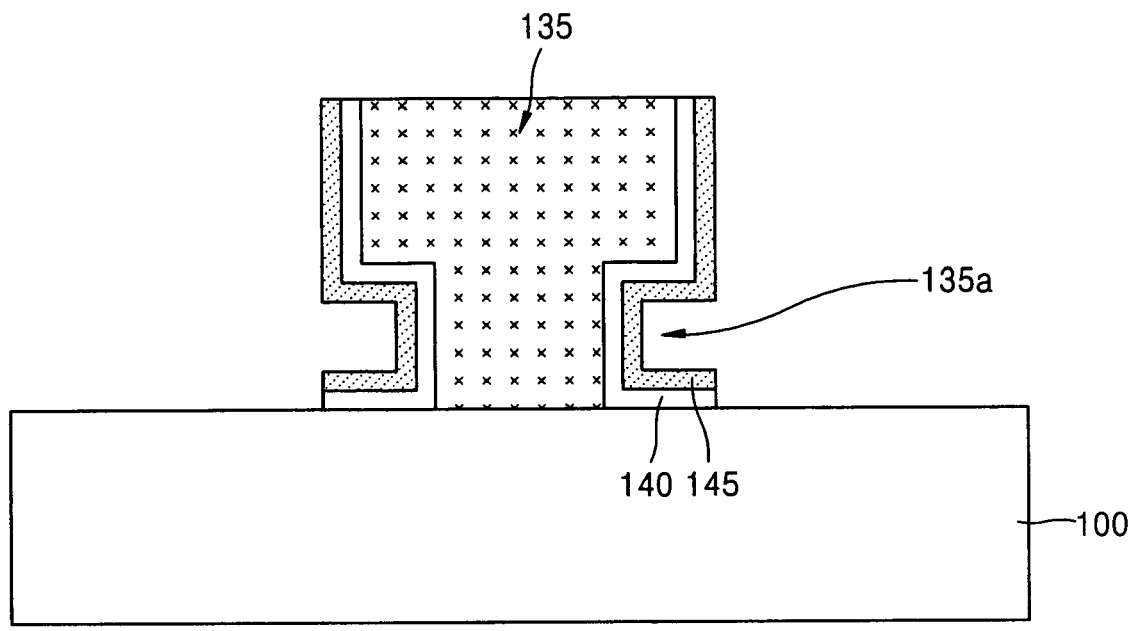

In FIG. 4E, the resulting structure is next anisotropically etched using the T-shaped structure 135 as a mask to remove portions of the nitride layer 145 and the first oxide layer 140 from the surface of the substrate 100. During this step, a small portion of the upper surface of the dielectric material of the T-shaped structure 135 is also etched.

Figure 4F:
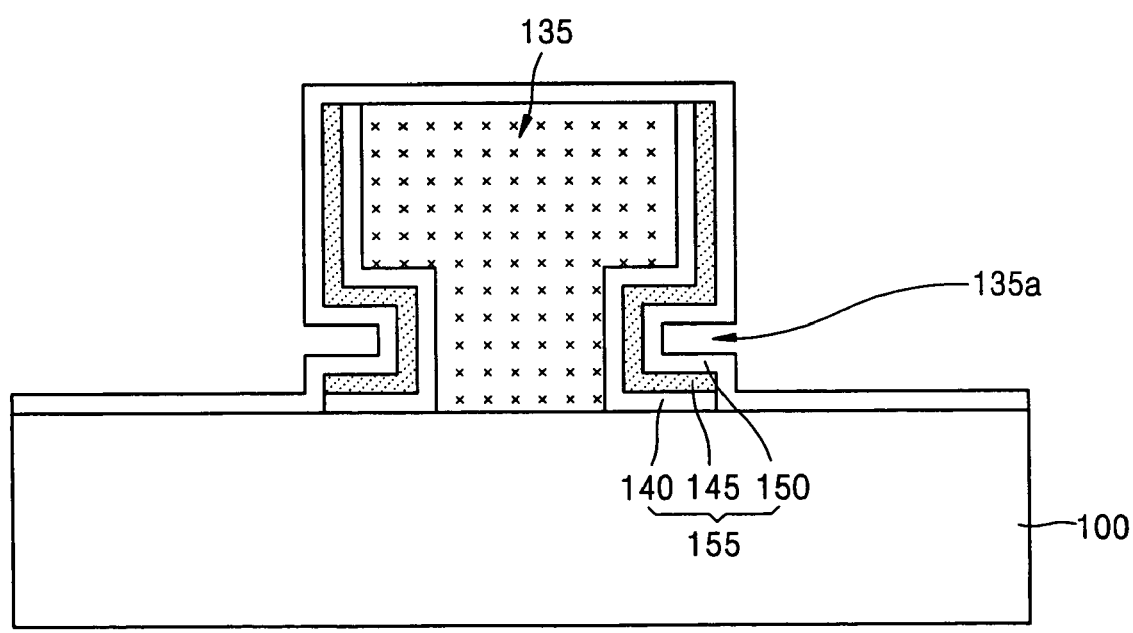

In FIG. 4F, a second oxide layer 150 is then formed on the surface of the resultant structure, including the exposed upper surface of the dielectric T-shaped structure 135, side surfaces 135a of the T-shaped structure 135 having the nitride layer 145, the upper surface of the horizontal portion of the nitride layer 145 formed on the first oxide layer 140, and the remaining exposed surfaces of the semiconductor substrate 100. In one embodiment, the second oxide layer 150 comprises $SiO_2$ formed by CVD at a temperature of 650C.–700C. followed by a rapid thermal annealing (RTA) process at a temperature of 900C.–1100C. The respective thicknesses of the first oxide layer 140 and the second oxide layer 150 may be different, depending on the respective processes used in their formation.

Figure 4G:
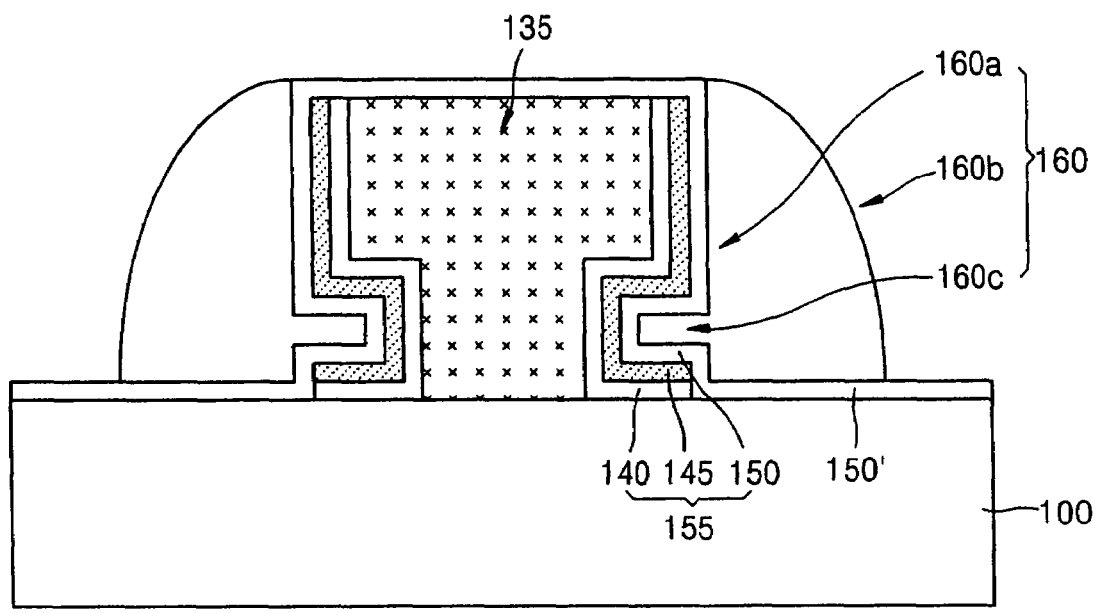

In FIG. 4G, control gates 160 are formed on sides of the resulting T-shaped structure 135 as shown. A conductive material layer is formed on the resulting structure. In one embodiment, the conductive material layer comprises polysilicon that is formed by CVD to a thickness of 2000–4000 Å. The resulting polysilicon layer is then anisotropically etched to form lateral conductive gates 160 on outer side walls of the T-shaped structure. The resulting conductive gates 160 include a main body 160a, an outer surface 160b and a lateral extension 160c. The lateral extension 160c extends beneath the relatively wide upper portion of the T-shaped structure 135, and above the horizontal portion of the second oxide layer 150 that lies above the nitride layer 145 and first oxide layer 140, to form a SONOS structure, as described below.

Figure 4H:
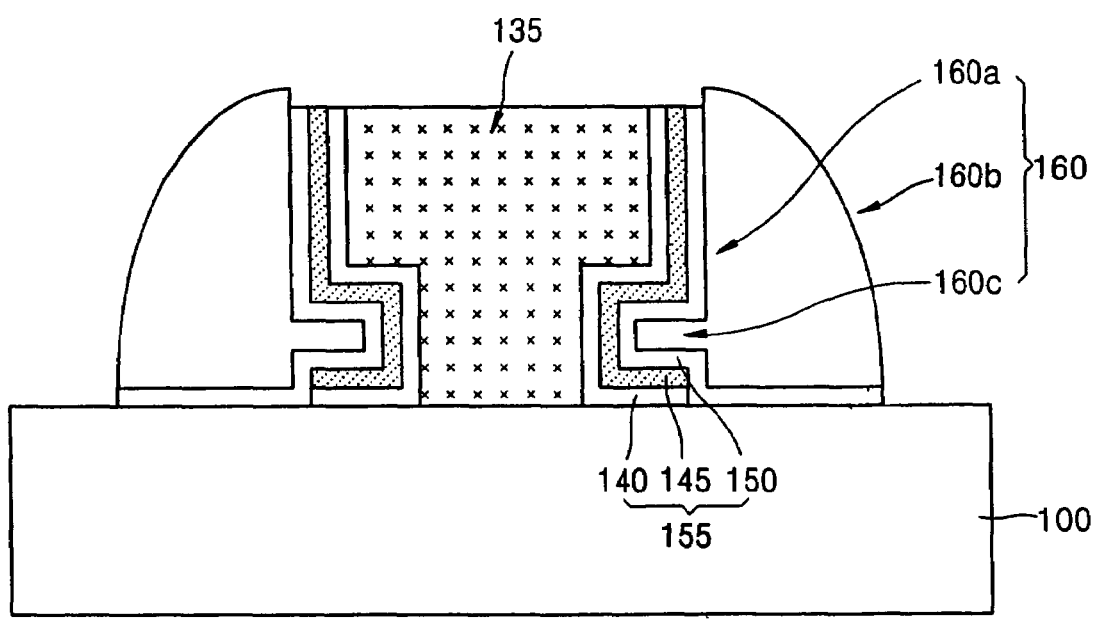

In FIG. 4H, the second oxide layer 150 is removed using the resulting structure as an etch mask. During removal of the second oxide layer 150 from the surface of the substrate 100, a portion of the layer on the top surface of the T-shaped structure 135 is also removed.

Figure 4I:
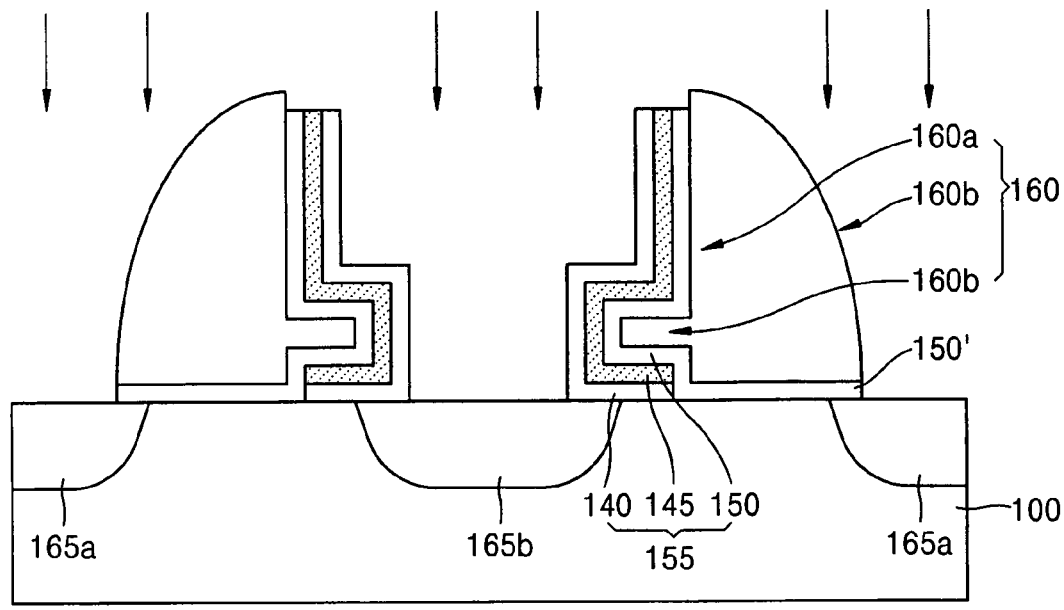

In FIG. 4I, the dielectric material of the T-shaped structure 135 is removed. In one embodiment, the T-shaped structure is wet-etched using $H_3PO_4$ solution. This results in the substrate being exposed in the void between the resulting control gate structures 160. A drain region 165b and source regions 165a are then formed in the exposed substrate 100, for example using an ion implantation of arsenic (As) or phosphorous (P). An advantage of this embodiment, is that a single ion implantation process is used to form both the drain region 165b and source region 165a, which leads to greater efficiency in the manufacturing process.

Figure 4J:
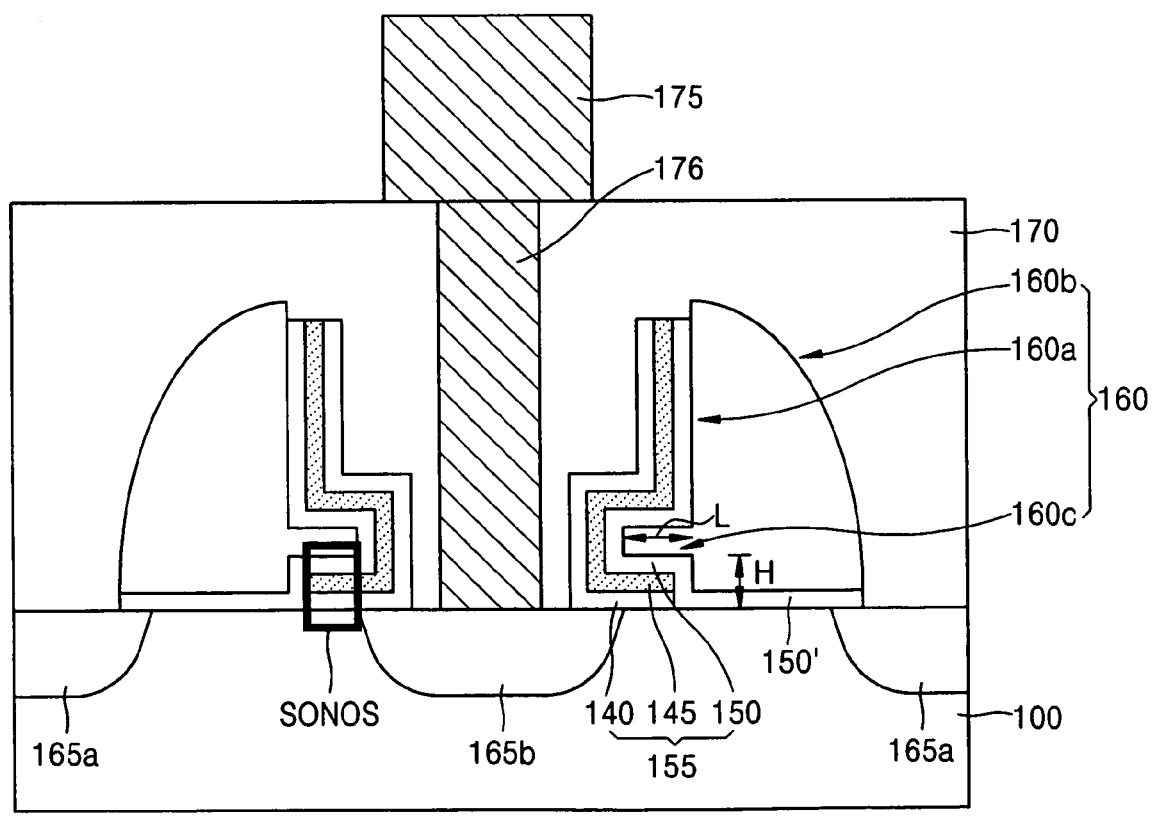

In FIG. 4J, an inter-layer dielectric (ILD) material layer 170 is deposited on the resulting structure and fills the T-shaped void between the control gates 160. In one example, the ILD layer 170 comprises oxide $SiO_2$ that is formed by CVD to a thickness that is sufficient for coating the resultant structure. The ILD layer 170 is then etched to form openings for access to the drain region 125 and source regions 165 and a metal deposition is performed to form metal plugs 176 in the openings. A metal contact is then patterned on the ILD layer 170 above the metal plugs 176 using conventional means.

As mentioned above, the resulting device includes a SONOS structure, as illustrated in the highlighted region of FIG. 4J. The SONOS structure includes the Silicon of the semiconductor substrate 100, the Oxide of the first oxide tunneling layer 140, the Nitride of the local-length nitride layer 145 that operates as a charge trapping layer, the Oxide of the second oxide layer 140, and the Silicon of the lateral extension 160c of the polysilicon control gate 160. The respective horizontal lengths of the resulting local-length nitride layers 145 on opposite sides of the T-shaped structure 135 are controlled by the geometry of the T-shaped structure 135 itself. In addition, corresponding length L of the control gate extension 160c, and the combined thickness H of the ONO layer 155 are also determined according to the geometry of the T-shaped structure 135 As in the first embodiment, the geometry, and symmetry, of the T-shaped structure is determined based on the ability to form symmetrical spacers 120, which can be controlled to a high degree of precision, based on the anisotropic etching process for forming the spacers. In this manner, the resulting horizontal lengths of the opposed local-length nitride layers 145 are predictable and symmetric. As a result of the local-length nitride structures, lateral electron movement is mitigated or prevented, and because the nitride structures are self-aligned, their lengths are more consistent and predicable; therefore, variation in the threshold voltages of the resulting devices is mitigated.

While this invention has been particularly shown and described with references to preferred embodiments thereof, it will be understood by those skilled in the art that various changes in form and details may be made herein without departing from the spirit and scope of the invention as defined by the appended claims.

We claim:
1. A semiconductor device comprising:
   a semiconductor substrate;
   first and second spaced apart junction regions provided in the semiconductor substrate;
   a first dielectric layer on the semiconductor substrate between the first and second junction regions;
   a second dielectric layer on a first portion of the first dielectric layer;
   a conductor having a body portion formed on a second portion of the first dielectric layer, and having a lateral extension portion above the second dielectric layer, the lateral extension extending from a first side wall of the body portion below a top of the first side wall, wherein a top surface of the lateral extension is below a top surface of the body portion, the body portion and the lateral extension portion being spaced apart from the second dielectric layer.

2. The semiconductor device of claim 1 wherein the body portion of the conductor has a second outer side wall opposite the first side wall that is curved.

3. The semiconductor device of claim 2 wherein the body portion of the conductor is formed in an anisotropic etching process.

4. The semiconductor device of claim 1 wherein the second dielectric layer encompasses the lateral extension portion of the conductor.

5. The semiconductor device of claim 1 wherein the second dielectric layer extends along a portion of the bottom of the lateral extension portion of the conductor, a side of the lateral extension portion of the conductor, and a portion of a top of the lateral extension of the conductor.

6. The semiconductor device of claim 5 wherein the second dielectric layer further extends along a portion of the first side wall of the conductor.

7. The semiconductor device of claim 1 wherein the lateral extension extends from a lower region of the side wall.

8. The semiconductor device of claim 1 wherein the first dielectric layer comprises silicon oxide.

9. The semiconductor device of claim 1 wherein the second dielectric layer comprises a charge trapping layer.

10. The semiconductor device of claim 1 wherein the second dielectric layer comprises silicon nitride.

11. The semiconductor device of claim 1 wherein the conductor comprises a control gate.

12. The semiconductor device of claim 1 wherein the conductor comprises polysilicon.

13. The semiconductor device of claim 1 wherein the second dielectric layer comprises a floating gate.

14. The semiconductor device of claim 1 wherein the first junction region comprises one of a drain and source region and wherein the second junction region comprises the other of the drain and source regions.

15. The semiconductor device of claim 1 further comprising a third dielectric layer between the body portion and the lateral extension portion of the conductor and the second dielectric layer.

16. The semiconductor device of claim 15 wherein the third dielectric layer comprises a material that is the same as that of the first dielectric layer.

17. The semiconductor device of claim 15 wherein the first dielectric layer comprises an oxide layer, the second dielectric layer comprises a nitride layer, and the third dielectric layer comprises an oxide layer, and wherein the first, second and third dielectric layers form an ONO structure that is positioned between an upper surface of the substrate and a lower surface of the lateral extension portion of the conductor.

18. The semiconductor device of claim 17 wherein the ONO structure has a thickness ranging between about 100 Å and 300 Å, and wherein the lateral extension portion of the conductor is on the ONO structure.

19. The semiconductor device of claim 18 wherein the ONO structure has a thickness of about 140 Å.

20. The semiconductor device of claim 1 wherein the lateral extension of the conductor has a length ranging between about 1000 Å and 2000 Å.

21. The semiconductor device of claim 20 wherein the lateral extension of the conductor has a length of about 1500 Å.

22. A semiconductor device comprising:
a semiconductor substrate;
first and second spaced apart junction regions provided in the semiconductor substrate;
a first dielectric layer on the semiconductor substrate between the first and second junction regions;
a second dielectric layer on a first portion of the first dielectric layer;
a conductor having a body portion formed on a second portion of the first dielectric layer, and having a lateral extension portion above the second dielectric layer, the lateral extension extending from a first side wall of the body portion below a top of the first side wall, the body portion and the lateral extension portion being spaced apart from the second dielectric layer, wherein the body portion of the conductor has a second outer side wall opposite the first side wall that is curved.

23. A semiconductor device comprising:
a semiconductor substrate;
first and second spaced apart junction regions provided in the semiconductor substrate;
a first dielectric layer on the semiconductor substrate between the first and second junction regions;
a second dielectric layer on a first portion of the first dielectric layer;
a conductor having a body portion formed on a second portion of the first dielectric layer, and having a lateral extension portion above the second dielectric layer, the lateral extension extending from a first side wall of the body portion below a top of the first side wall, the body portion and the lateral extension portion being spaced apart from the second dielectric layer, wherein the second dielectric layer encompasses the lateral extension portion of the conductor.

24. A semiconductor device comprising:
a semiconductor substrate;
first and second spaced apart junction regions provided in the semiconductor substrate;
a first dielectric layer on the semiconductor substrate between the first and second junction regions;
a second dielectric layer on a first portion of the first dielectric layer;
a conductor having a body portion formed on a second portion of the first dielectric layer, and having a lateral extension portion above the second dielectric layer, the lateral extension extending from a first side wall of the body portion below a top of the first side wall, the body portion and the lateral extension portion being spaced apart from the second dielectric layer, wherein the second dielectric layer extends along a portion of the bottom of the lateral extension portion of the conductor, a side of the lateral extension portion of the conductor, and a portion of a top of the lateral extension portion of the conductor.

25. The semiconductor device of claim 24 wherein the second dielectric layer further extends along a portion of the first side wall of the conductor.

26. A semiconductor device comprising:
a semiconductor substrate;
first and second spaced apart junction regions provided in the semiconductor substrate;
a first dielectric layer on the semiconductor substrate between the first and second junction regions;
a second dielectric layer on a first portion of the first dielectric layer;
a conductor having a body portion formed on a second portion of the first dielectric layer, and having a lateral extension portion above the second dielectric layer, the lateral extension extending from a first side wall of the body portion below a top of the first side wall, the body portion and the lateral extension portion being spaced apart from the second dielectric layer, wherein the lateral extension extends from a lower region of the side wall.

27. A semiconductor device comprising:
a semiconductor substrate;
first and second spaced apart junction regions provided in the semiconductor substrate;
a first dielectric layer on the semiconductor substrate between the first and second junction regions;
a second dielectric layer on a first portion of the first dielectric layer;
a conductor having a body portion formed on a second portion of the first dielectric layer, and having a lateral extension portion above the second dielectric layer, the lateral extension extending from a first side wall of the body portion below a top of the first side wall, the body portion and the lateral extension portion being spaced apart from the second dielectric layer, wherein the first junction region comprises one of a drain and source region and wherein the second junction region comprises the other of the drain and source regions.

* * * * *